(12) United States Patent
Hyeon et al.

(10) Patent No.: US 11,672,159 B2
(45) Date of Patent: Jun. 6, 2023

(54) DISPLAY APPARATUS HAVING DUMMY CONTACT HOLES

(71) Applicant: Samsung Display Co., Ltd., Yongin-si (KR)

(72) Inventors: Juhee Hyeon, Yongin-si (KR); Hyunchol Bang, Yongin-si (KR); Youngtaeg Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/208,562

(22) Filed: Mar. 22, 2021

(65) Prior Publication Data

US 2021/0210566 A1 Jul. 8, 2021

Related U.S. Application Data

(63) Continuation of application No. 16/123,270, filed on Sep. 6, 2018, now Pat. No. 10,978,519.

(30) Foreign Application Priority Data

Dec. 20, 2017 (KR) .................. 10-2017-0176487

(51) Int. Cl.
*H10K 59/88* (2023.01)
*H10K 50/15* (2023.01)
*H10K 50/16* (2023.01)
*H01L 27/32* (2006.01)
*H01L 51/50* (2006.01)
(Continued)

(52) U.S. Cl.
CPC ....... *H01L 27/3223* (2013.01); *G09G 3/3225* (2013.01); *H01L 27/3246* (2013.01); *H01L 27/3276* (2013.01); *H01L 51/105* (2013.01); *H01L 51/5012* (2013.01);
(Continued)

(58) Field of Classification Search
CPC .................................................. H01L 27/3223
See application file for complete search history.

(56) References Cited

U.S. PATENT DOCUMENTS 5,874,777 A 2/1999 Ohmi et al.
6,366,331 B1 4/2002 Sakamoto et al.
(Continued)

FOREIGN PATENT DOCUMENTS

JP 2016-92367 5/2016
KR 10-2006-0039557 5/2006
(Continued)

*Primary Examiner* — Caleb E Henry
(74) *Attorney, Agent, or Firm* — Kile Park Reed & Houtteman PLLC (57) ABSTRACT

A display apparatus including a substrate including a display area and a peripheral area outside the display area, a first insulating layer over the substrate in the display area and the peripheral area, the first insulating layer including a plurality of first contact holes located in the display area, a plurality of second contact holes located in the peripheral area, and a plurality of dummy contact holes located between the plurality of first contact holes and the plurality of second contact holes, first wirings filling the plurality of first contact holes, second wirings filling the plurality of second contact holes, and a second insulating layer covering the first wirings and the second wirings and filling the plurality of dummy contact holes.

17 Claims, 6 Drawing Sheets

(51) Int. Cl.
*H01L 51/10* (2006.01)
*G09G 3/3225* (2016.01)

(52) U.S. Cl.
CPC ...... *H01L 51/5056* (2013.01); *H01L 51/5072* (2013.01); *H01L 51/5092* (2013.01)

(56) References Cited

U.S. PATENT DOCUMENTS

| | | | |
|---|---|---|---|
| 6,815,787 B1* | 11/2004 | Yaung | H01L 27/14603 257/292 |
| 8,059,076 B2 | 11/2011 | Jung et al. | |
| 8,093,804 B2 | 1/2012 | Lee et al. | |
| 8,324,671 B2 | 12/2012 | Dote et al. | |
| 9,276,049 B2 | 3/2016 | Go | |
| 9,728,260 B1 | 8/2017 | Su et al. | |
| 9,953,576 B2 | 4/2018 | Choi et al. | |
| 10,038,038 B2 | 7/2018 | Kim | |
| 10,256,285 B2 | 4/2019 | Matsumoto et al. | |
| 10,269,877 B2 | 4/2019 | Hwang | |
| 2005/0030403 A1* | 2/2005 | Yaung | H01L 27/14603 348/308 |
| 2006/0146219 A1 | 7/2006 | Jeong et al. | |
| 2006/0278918 A1 | 12/2006 | Inoue | |
| 2007/0158649 A1 | 7/2007 | Lee | |
| 2008/0067697 A1* | 3/2008 | Kim | H01L 29/66621 257/784 |
| 2011/0062540 A1* | 3/2011 | Saito | H01L 27/1464 438/69 |
| 2011/0227182 A1* | 9/2011 | Aoki | H01L 27/14636 257/435 |
| 2011/0233620 A1* | 9/2011 | Naruse | H01L 27/14636 257/E31.085 |
| 2012/0012843 A1 | 1/2012 | Matsubara | |
| 2012/0068294 A1* | 3/2012 | Lee | H01L 27/14625 257/431 |
| 2012/0292621 A1 | 11/2012 | Kim et al. | |
| 2013/0182162 A1* | 7/2013 | Hirayama | H01L 27/14683 438/98 |
| 2013/0271677 A1 | 10/2013 | Koo | |
| 2014/0080296 A1 | 3/2014 | Baek et al. | |
| 2015/0200239 A1 | 7/2015 | Jung | |
| 2016/0133516 A1* | 5/2016 | Ito | H01L 21/3212 438/618 |
| 2016/0321993 A1 | 11/2016 | Choi et al. | |
| 2017/0193914 A1 | 7/2017 | Heo et al. | |

FOREIGN PATENT DOCUMENTS

| | | |
|---|---|---|
| KR | 10-2008-0010522 | 1/2008 |
| KR | 10-2011-0056897 | 5/2011 |
| KR | 10-2014-0036823 | 3/2014 |
| KR | 10-2015-0092823 | 8/2015 |
| KR | 10-2017-0080002 | 7/2017 |
| KR | 10-2017-0084413 | 7/2017 |

* cited by examiner

DISPLAY APPARATUS HAVING DUMMY CONTACT HOLES

CROSS-REFERENCE TO RELATED APPLICATION(S)

This is a continuation application of U.S. patent application Ser. No. 16/123,270 filed Sep. 6, 2018 (now U.S. Pat. No. 10,978,519), the disclosure of which is incorporated herein by reference in its entirety. U.S. patent application Ser. No. 16/123,270 claims priority benefit of Korean Patent Application 10-2017-0176487 filed Dec. 20, 2017, in the Korean Intellectual Property Office, the disclosure of which is incorporated herein by reference in its entirety for all purposes.

BACKGROUND

1. Field

One or more embodiments relate to a display apparatus.

2. Description of the Related Art

In general, a display apparatus has a display area, and many pixels are located in the display area.

SUMMARY

Embodiments are directed to a display apparatus including a substrate including a display area and a peripheral area outside the display area, a first insulating layer over the substrate in the display area and the peripheral area, the first insulating layer including a plurality of first contact holes located in the display area, a plurality of second contact holes located in the peripheral area, and a plurality of dummy contact holes located between the plurality of first contact holes and the plurality of second contact holes, first wirings filling the plurality of first contact holes, second wirings filling the plurality of second contact holes, and a second insulating layer covering the first wirings and the second wirings and filling the plurality of dummy contact holes.

Each of the first wirings may be electrically connected to a corresponding one of the second wirings.

Each of the first wirings may be integrally formed with a corresponding one of the second wirings.

Each of the first wirings may include a same material as a corresponding one of the second wirings.

The first wirings may be electrically connected to conductive layers. The second wirings may be electrically connected to the conductive layers.

The display apparatus may further include a plurality of first semiconductor layers between the substrate and the first insulating layer. At least a part of an upper surface of each of the plurality of first semiconductor layers that faces the first insulating layer, is located at a lower end the plurality of first contact holes, and a plurality of second semiconductor layers between the substrate and the first insulating layer, wherein at least a part of an upper surface of each of the plurality of second semiconductor layers that faces the first insulating layer is located at a lower end of the plurality of second contact holes.

The display apparatus may further include a plurality of dummy semiconductor layers between the substrate and the first insulating layer. At least a part of an upper surface of each of the plurality of dummy semiconductor layers that faces the first insulating layer is located at a lower end of the plurality of dummy contact holes.

At least a portion of an edge of the display area may have a round shape. The plurality of dummy contact holes may be located adjacent to the portion of the display area having the round shape.

An edge of the display area may include a first portion and a second portion. Some contact holes of the plurality of first contact holes and some contact holes of the plurality of second contact holes may be located adjacent to the first portion. Other contact holes of the plurality of first contact holes and other contact holes of the plurality of second contact holes may be located adjacent to the second portion. The plurality of dummy contact holes may be located adjacent to the second portion.

A shortest distance between the some contact holes of the plurality of first contact holes and the some contact holes of the plurality of second contact holes may be less than a shortest distance between the other contact holes of the plurality of first contact holes and the other contact holes of the plurality of second contact holes.

The second portion may have a curved shape.

The display apparatus may further include a conductive material layer located in the plurality of dummy contact holes. An end portion of the conductive material layer facing the second insulating layer may be located in the plurality of dummy contact holes.

A surface of the first wiring facing the substrate may directly contact a surface of the first insulating layer facing away from the substrate.

The display apparatus may further include connecting wires that electrically connect each of the first wirings to corresponding ones of the second wirings. An edge of the display area may include a first portion and a second portion. Some contact holes of the plurality of first contact holes and some contact holes of the plurality of second contact holes may be located adjacent to the first portion. Other contact holes of the plurality of first contact holes and other contact holes of the plurality of second contact holes may be located adjacent to the second portion. The plurality of dummy contact holes may be located adjacent to the second portion. The connecting wires may include first connecting wires passing between the plurality of dummy contact holes and second connecting wires other than the first connecting wires. A largest distance between closest ones of the first connecting wires may be greater than a largest distance between closest ones of the second connecting wires.

Embodiments are also directed to a display apparatus including a substrate including a display area and a peripheral area outside the display area, a first insulating layer over the substrate in the display area and the peripheral area, the first insulating layer including a plurality of first contact holes located in the display area, a plurality of second contact holes located in the peripheral area, and a plurality of dummy contact holes located between the plurality of first contact holes and the plurality of second contact holes, and connecting wires electrically connecting a material filling each of the plurality of first contact holes and a material filling a corresponding one of the plurality of second contact holes, and passing between the plurality of dummy contact holes.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
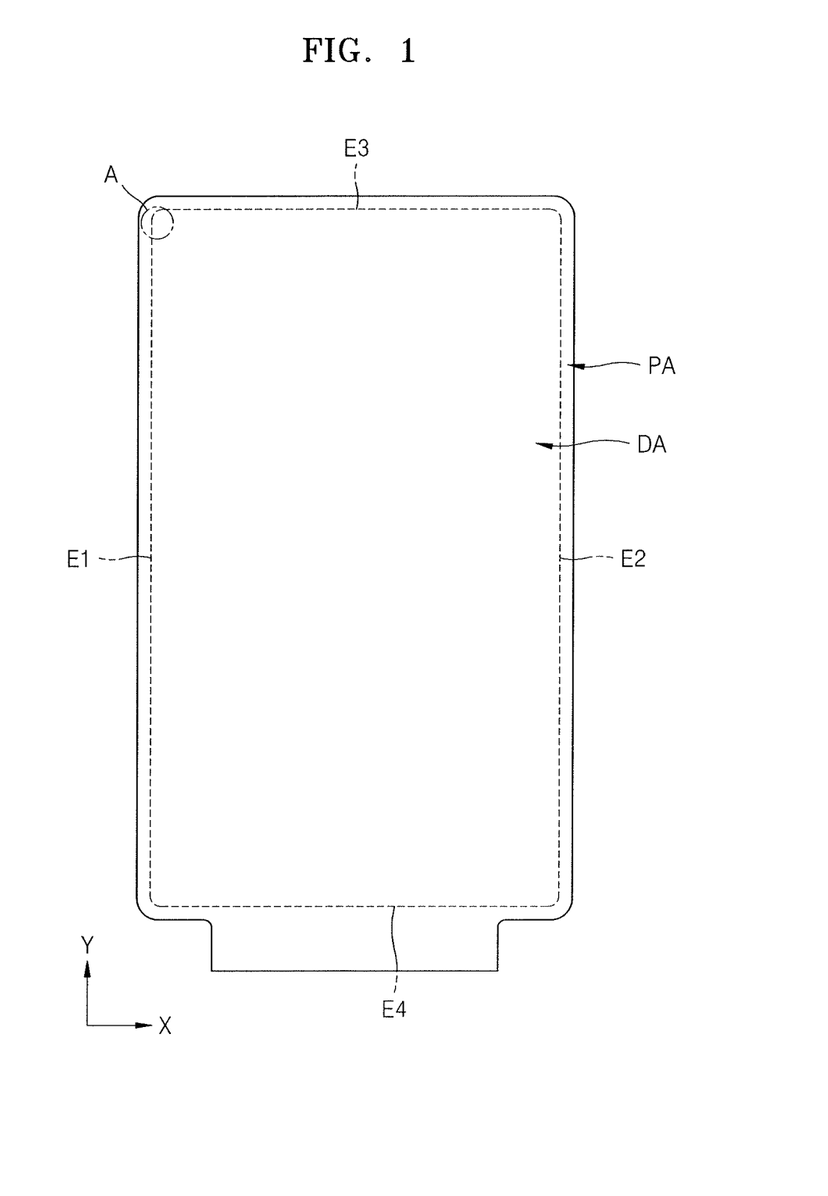
FIG. 1 illustrates a conceptual diagram schematically depicting a display apparatus in a manufacturing process according to an embodiment.
Figure 2:
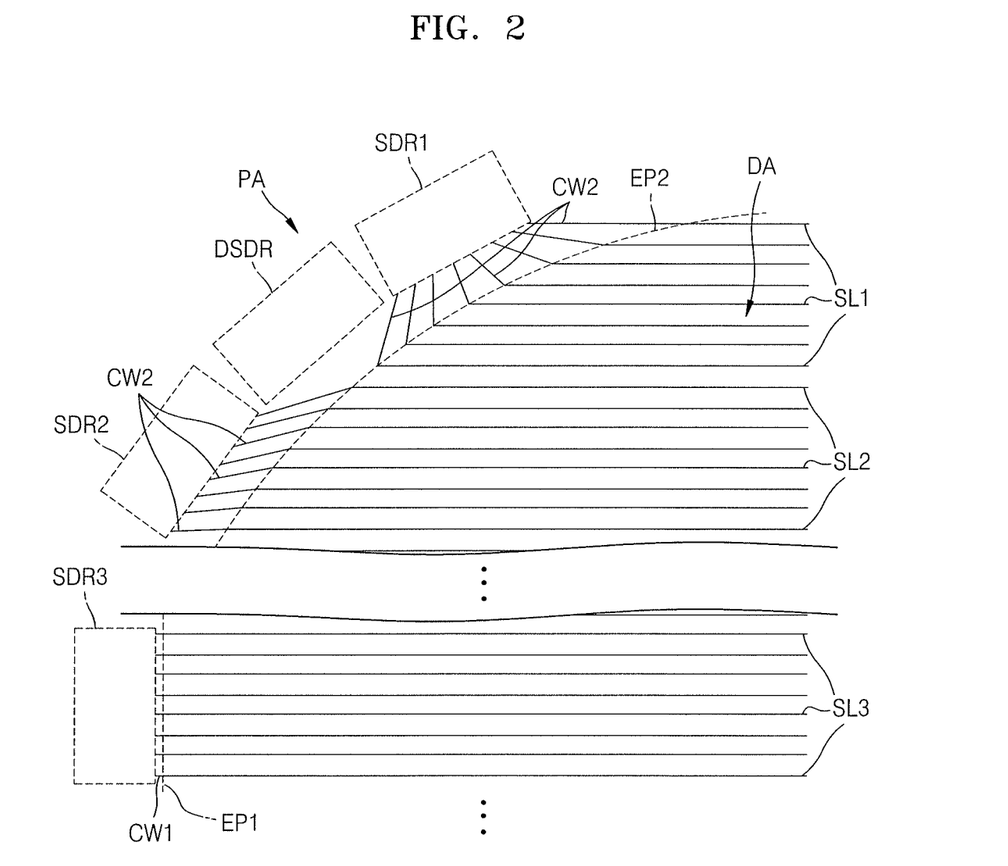
FIG. 2 illustrates a conceptual diagram schematically depicting a portion A of FIG. 1.

FIG. 1 is a conceptual diagram schematically illustrating a display apparatus in a manufacturing process according to an embodiment. FIG. 2 is a conceptual diagram schematically illustrating a portion A of FIG. 1.

The display apparatus according to the embodiment illustrated in FIG. 1 may include a display area DA where a plurality of pixels are located and a peripheral area PA disposed outside the display area DA. A substrate 100 (see FIG. 4) may be understood to have the display area DA and the peripheral area PA. Various electronic components or printed circuit substrates may be electrically attached to the peripheral area PA. Also, various electronic components may be directly formed in the peripheral area PA of the substrate 100.

The substrate 100 may include a suitable material such as, for example, glass or metal. In some implementations, the substrate 100 may include various materials having flexible or bendable characteristics, for example, a polymer resin such as polyethersulfone (PES), polyacrylate, polyetherimide (PEI), polyethylene naphthalate (PEN), polyethylene terephthalate (PET), polyphenylene sulfide (PPS), polyallylate (PAR), polyimide (PI), polycarbonate (PC), or cellulose acetate propionate (CAP). The substrate 100 may be modified in various ways. For example, the substrate 100 may have a multilayer structure of two layers, each layer including polymer resin, and a barrier layer disposed between the layers and including an inorganic material such as silicon oxide, silicon nitride, or silicon oxynitride.

The edge of the display area DA may have an overall shape similar as a whole to a rectangle or a square. However, as illustrated in FIGS. 1 and 2, the display area DA may include a rounded shape at a portion A at a corner edge. In detail, the display area DA may include a first edge E1 and a second edge E2 facing each other and a third edge E3 and a fourth edge E4 facing each other and located between the first edge E1 and the second edge E2. A pad area may be adjacent to the fourth edge E4. The portion A having a round shape may connect the first edge E1 and the third edge E3. The display area DA may also have a round shape in a portion of the edge other than the portion A. For example, a portion connecting the second edge E2 and the third edge E3 may have a round shape. The display area DA may have a round shape in other portions of the edge.

As illustrated in FIGS. 1 and 2, in a normal use environment in which a user uses the display apparatus according to the present embodiment or an electronic apparatus including the display apparatus, the portion A of the edge is recognized to have a round shape, that is, a curved shape. However, when the portion A is magnified enough to view wires having a width of several micrometers or tens of micrometers, the portion A may appear to have a linear shape bent a plurality of times. Although the portion A, when observed by being magnified, appears to have the linear shape bent a plurality of times, in the normal use environment, the portion A is recognized to have a round shape, that is, a curved shape. Accordingly, in the following description, the portion A is described as having a round shape.

A plurality of pixels are located in the display area DA along the portion A having the round shape. For convenience of illustration, FIG. 2 does not illustrate pixels. Various signals may be applied to the pixels in the display area DA. For example, in order to apply a data signal for controlling brightness to pixels located in a row horizontally extending in FIG. 2, a scan signal may be applied to the pixels in the row to select the pixels of the row. To this end, various wires such as scan lines that are illustrated to horizontally extend in FIG. 2 may be located inside and outside the display area DA. FIG. 2 illustrates scan lines SL1, SL2, and SL3. The scan lines SL1, SL2, and SL3, as described below, may include the same material as a source electrode 215a or a drain electrode 215b of a thin film transistor 210 (see FIG. 4) and may be located in the same layer, may include the same material as a gate electrode 213 (see FIG. 4) and may be located in the same layer, or may be located in a separate layer.

A drive circuit may be located in the peripheral area PA, as illustrated in FIG. 2. FIG. 2 illustrates that a first scan drive circuit SDR1, a second scan drive circuit SDR2, and a third scan drive circuit SDR3 are located in the peripheral area PA outside the display area DA. The first scan drive circuit SDR1 to the third scan drive circuit SDR3 may generate scan signals to be applied to pixels in the display area DA via the scan lines SL1, SL2, and SL3. Accordingly, the scan lines SL1 may be electrically connected to the first scan drive circuit SDR1, the scan lines SL2 may be electrically connected to the second scan drive circuit SDR2, and the scan lines SL3 may be electrically connected to the third scan drive circuit SDR3. In some implementations, the first scan drive circuit SDR1 to the third scan drive circuit SDR3 may not be separated from one another, but instead may be a single scan drive circuit.

For reference, the functions of the first scan drive circuit SDR1 to the third scan drive circuit SDR3 may be implemented by a thin film transistor and/or a capacitor formed on the substrate, and not by electronic components attached on the substrate 100. For example, thin film transistors and/or capacitors may be formed to control emission or a degree of emission of the pixels in the display area DA. When the thin film transistors and/or capacitors are formed in the display area DA, thin film transistors and/or capacitors may be simultaneously formed of the same material in the peripheral area PA, thereby forming the first scan drive circuit SDR1 to the third scan drive circuit SDR3.

The first scan drive circuit SDR1 to the third scan drive circuit SDR3 and the scan lines SL1, SL2, and SL3 may be electrically connected to each other. To this end, connecting wires CW1 and CW2 may be provided between the first scan drive circuit SDR1 to the third scan drive circuit SDR3 and the scan lines SL1, SL2, and SL3. The connecting wires CW1 and CW2 may include the same material as the source electrode 215a or the drain electrode 215b of the thin film transistor 210, which is described below, and may be located in the same layer or in another separate layer. The connecting wires CW1 and CW2 may be located in a different layer from the scan lines SL1, SL2, and SL3. The connecting wires CW1 and CW2 may be connected to the scan lines SL1, SL2, and SL3 via a contact hole formed in an insulating layer between the connecting wires CW1 and CW2 and the scan lines SL1, SL2, and SL3. In some implementations, the connecting wires CW1 and CW2 and the scan lines SL1, SL2, and SL3 may be simultaneously formed of the same material in the same layer. In this case, bridge wires electrically connecting the connecting wires CW1 and CW2 and the scan lines SL1, SL2, and SL3 may be located in a different layer from the connecting wires CW1 and CW2 and the scan lines SL1, SL2, and SL3. Each of the connecting wires CW1 and CW2 and any one of the scan lines SL1, SL2, and SL3 corresponding thereto may be formed in one body.

As illustrated in FIGS. 1 and 2, in a first portion EP1 that is a part of the first edge E1 that is a linear edge of the edges of the display area DA, a gap between the third scan drive circuit SDR3 located adjacent to the first portion EP1 and the first portion EP1 may be small. In particular, in order to reduce a dead space in the display apparatus by increasing a ratio of the display area DA in the entire surface of the substrate 100, the gap between the third scan drive circuit SDR3 and the first portion EP1 may be minimized.

However, as illustrated in FIG. 2, in a second portion EP2 that is a curved edge of the display area DA, a gap between the first scan drive circuit SDR1 or the second scan drive circuit SDR2, which are located adjacent to the second portion EP2, and the second portion EP2 may be relatively large. For example, the gap between the first scan drive circuit SDR1 or the second scan drive circuit SDR2, which are located adjacent to the second portion EP2, and the second portion EP2 is greater than the gap between the third scan drive circuit SDR3 and the first portion EP1 due to the curved shape of the second portion EP2. Thus, extension directions of the connecting wire CW2 connecting the first scan drive circuit SDR1 and the scan lines SL1 and the connecting wire CW2 connecting the second scan drive circuit SDR2 and the scan lines SL2 are not uniform, Accordingly, the length of the connecting wire CW2 is increased.

Figure 3:
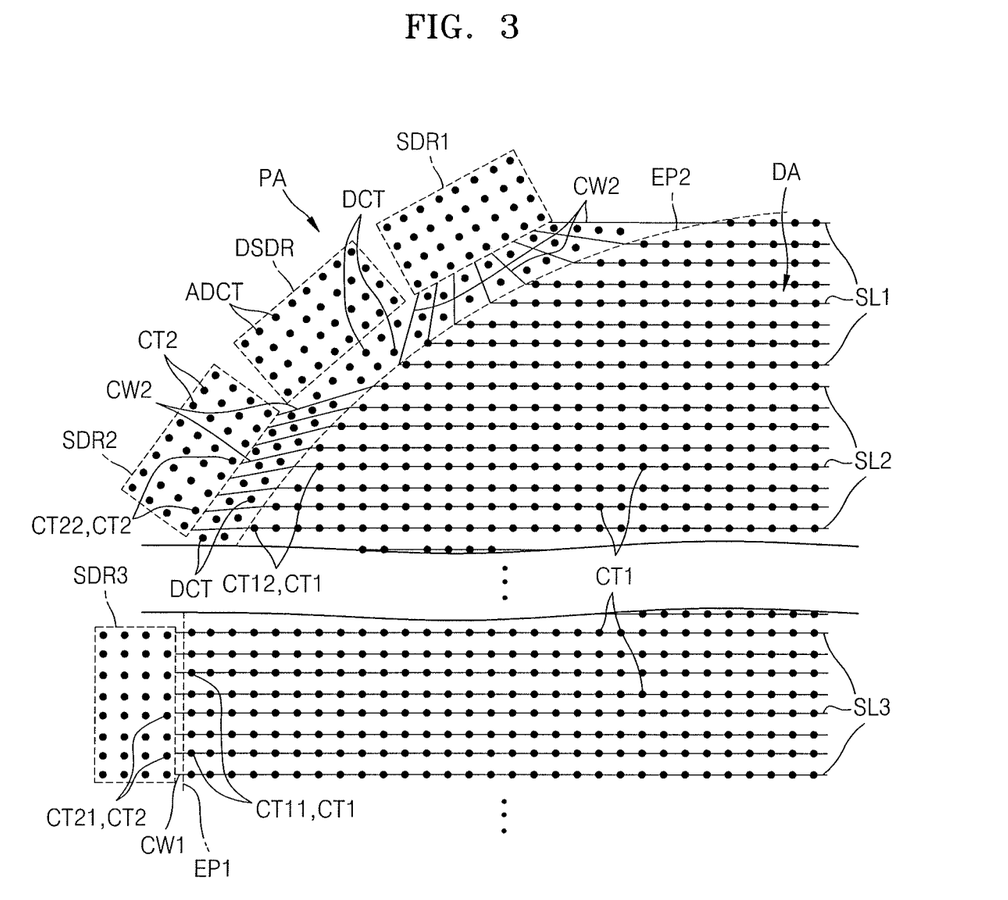
FIG. 3 illustrates a conceptual diagram schematically depicting positions of contact holes in FIG. 2.
Figure 4:
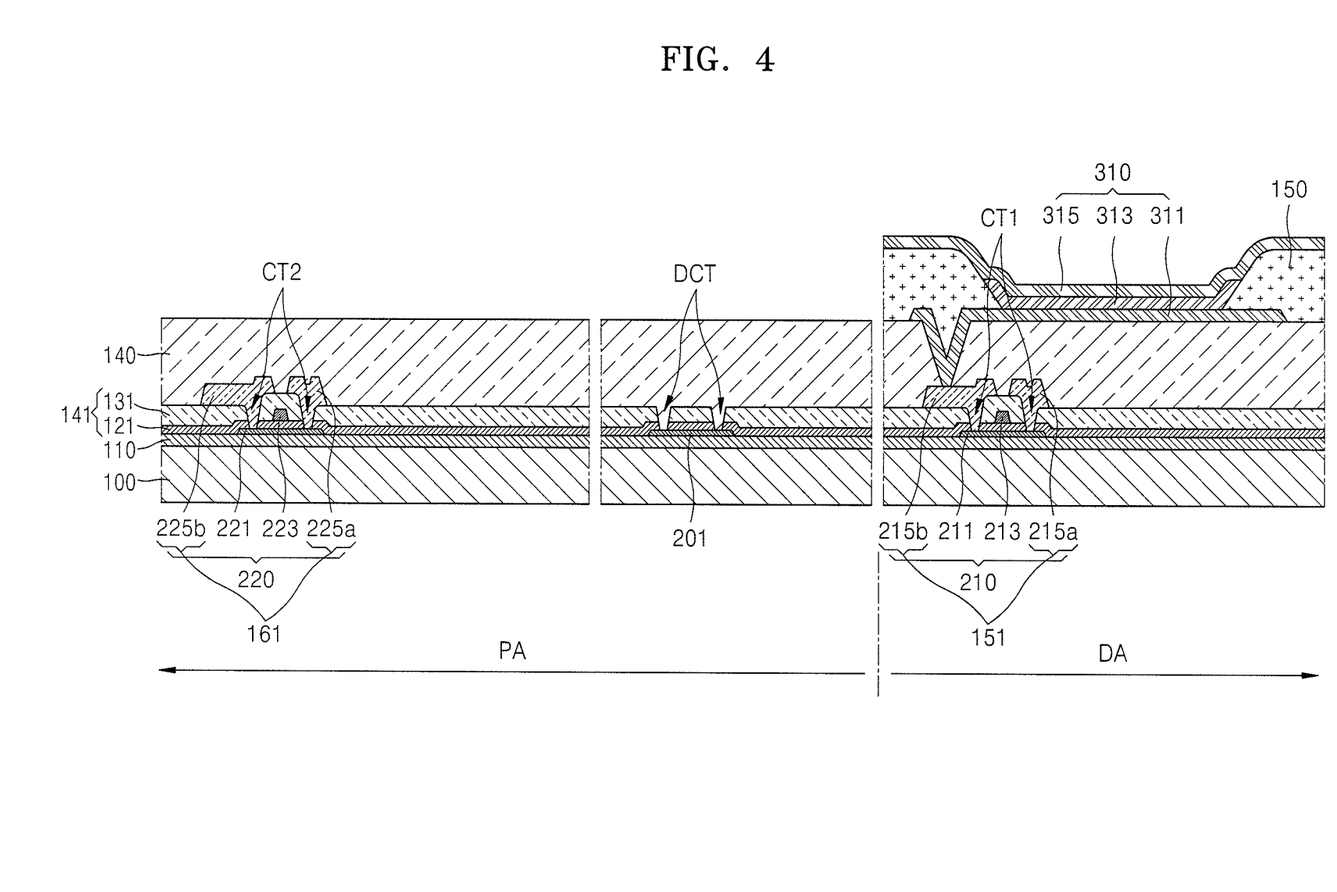
FIG. 4 illustrates a cross-sectional view schematically depicting a portion of the display apparatus of FIG. 1.

FIG. 3 illustrates a conceptual diagram schematically depicting positions of contact holes in FIG. 2. As illustrated in FIG. 4, thin film transistors are located in the pixels in the display area DA. In each of the thin film transistors, a first semiconductor layer (211, see FIG. 4) is located under a first insulating layer 141 and a source electrode (215a, see FIG. 4) and a drain electrode (215b, see FIG. 4) are located over the first insulating layer 141. The source electrode 215a and the drain electrode 215b contact the first semiconductor layer 211 thereunder via contact holes formed in the first insulating layer 141 provided between the first semiconductor layer 211 and the source and drain electrodes 215a and 215b. Accordingly, a plurality of first contact holes CT1 are located in the first insulating layer 141 in the display area DA as illustrated in FIG. 3. The first contact holes CT1 are located in the first insulating layer 141 in the display area DA at an approximately uniform density.

Among the first contact holes CT1, some contact holes CT11 are located adjacent to the first portion EP1 that is a part of the first edge E1 that is a linear edge of the edges of the display area DA. Other contact holes CT12 of the first contact holes CT1 are located adjacent to the second portion EP2 that is a curved edge of the edges of the display area DA.

Thin film transistors are located in the areas of the first scan drive circuit SDR1 to the third scan drive circuit SDR3. In each of the thin film transistors, a second semiconductor layer (221, see FIG. 4) is located under the first insulating layer 141 and a source electrode (225a, see FIG. 4) and a drain electrode (225b, see FIG. 4) are located above the first insulating layer 141. The source electrode 225a and the drain electrode 225b may contact the second semiconductor layer 221 thereunder via contact holes formed in the first insulating layer 141 provided between the second semiconductor layer 221 and the source and drain electrodes 225a and 225b. Accordingly, a plurality of second contact holes CT2 are located in the first insulating layer 141 of the display area DA as illustrated in FIG. 3. The second contact holes CT2 are located in the first insulating layer 141 in the first scan drive circuit SDR1 to the third scan drive circuit SDR3, in an approximately uniform density.

Among the second contact holes CT2, some contact holes CT21 are located adjacent to the first portion EP1 that is a part of the first edge E1 that is a linear edge of the edges of the display area DA. Other contact holes CT22 of the second contact holes CT2 are located adjacent to the second portion EP2 that is a curved edge of the edges of the display area DA.

As described above, in the first portion EP1 that is a part of the first edge E1 that is a linear edge of the edges of the display area DA, the gap between the third scan drive circuit SDR3 located adjacent to the first portion EP1 and the first portion EP1 is relatively small. In the second portion EP2 that is a curved edge of the edges of the display area DA, the gap between the first scan drive circuit SDR1 or the second scan drive circuit SDR2, which is located adjacent to the second portion EP2, and the second portion EP2 is relatively large. For example, the gap between the first scan drive circuit SDR1 or the second scan drive circuit SDR2 located adjacent to the second portion EP2 and the second portion EP2 is greater than the gap between the third scan drive circuit SDR3 and the first portion EP1. Accordingly, the shortest distance between the some contact holes CT11 of the first contact holes CT1 and the some contact holes CT21 of the second contact holes CT2 is less than the shortest distance between the other contact holes CT12 of the first contact holes CT1 and the other contact holes CT22 of the second contact holes CT2.

In the display apparatus according to the present embodiment, the first insulating layer 141 may include a plurality of dummy contact holes DCT. The dummy contact holes DCT may be located between the first contact holes CT1 in the display area DA and the second contact holes CT2 in the peripheral area PA. The dummy contact holes DCT may also be located in the peripheral area PA. The dummy contact holes DCT may be located adjacent to the second portion EP2 that is a curved edge of the edges of the display area DA, for example, the second portion EP2 having a round shape of the edges of the display area DA. Accordingly, the density of the contact holes CT1, CT2, and DCT may be approximately uniform without a big change in the area between the first scan drive circuit SDR1 to the third scan drive circuit SDR3 and the display area DA, in the display area DA, and in the first scan drive circuit SDR1 to the third scan drive circuit SDR3.

FIG. 4 illustrates a cross-sectional view schematically depicting a portion of the display apparatus of FIG. 1. FIG. 4 is not a cross-sectional view taken along a line in FIG. 3, but may be understood as a cross-sectional view taken along a line passing through the second contact holes CT2 of a thin film transistor 220 of the first scan drive circuit SDR1 in the peripheral area PA, the dummy contact holes DCT in the peripheral area PA, and the first contact holes CT1 of the thin film transistor 210 in the display area DA.

As illustrated in FIG. 4, not only a display device 310, but also the thin film transistor 210 to which the display device 310 is electrically connected may be located in the display area DA of the substrate 100. FIG. 4 illustrates that an organic light-emitting device as the display device 310 is located in the display area DA. The electrical connection of the organic light-emitting device to the thin film transistor 210 may be by way of a pixel electrode 311 electrically connected to the thin film transistor 210.

The thin film transistor 210 may include a first semiconductor layer 211 including amorphous silicon, polycrystalline silicon, or an organic semiconductor material, the gate electrode 213, the source electrode 215a, and the drain electrode 215b. To secure insulation from the first semiconductor layer 211 and the gate electrode 213, a gate insulating layer 121 including an inorganic material such as silicon oxide, silicon nitride, and/or silicon oxynitride may be provided between the first semiconductor layer 211 and the gate electrode 213. In addition, an interlayer insulating layer 131 including an inorganic material such as silicon oxide, silicon nitride, and/or silicon oxynitride may be provided over the gate electrode 213. The source electrode 215a and the drain electrode 215b may be provided on the interlayer insulating layer 131. The gate insulating layer 121 and the interlayer insulating layer 131 altogether may be collectively referred to as the first insulating layer 141 provided between the source electrode 215a and the drain electrode 215b and the first semiconductor layer 211, as described above. The first insulating layer 141 includes the first contact holes CT1, and thus the source electrode 215a and the drain electrode 215b may contact the first semiconductor layer 211.

As such, an insulating layer 141 including an inorganic material may be formed by chemical vapor deposition (CVD) or atomic layer deposition (ALD). This will be applied to the below-described embodiments and modified examples thereof.

The gate electrode 213 may include a metal such as molybdenum or aluminum, and may have a single layer or multilayer structure. The source electrode 215a and the drain electrode 215b may include a metal such as titanium or aluminum, and may have a single layer or multilayer structure. For example the gate electrode 213 may have a tri-layer structure of molybdenum/aluminum/molybdenum, and the source electrode 215a and the drain electrode 215b may have a tri-layer structure of titanium/aluminum/titanium.

The same structures and compositions may be applied to the thin film transistor 220 that is described below.

A buffer layer 110 including an inorganic material such as silicon oxide, silicon nitride, and/or silicon oxynitride may be provided between the thin film transistor 210 and the substrate 100, which are configured as above. The buffer layer 110 may improve the smoothness of an upper surface of the substrate 100 and may prevent or reduce intrusion of foreign materials from the substrate 100 into the first semiconductor layer 211 of the thin film transistor 210.

A planarization layer 140 may be provided on the thin film transistor 210. For example, when an organic light-emitting device is provided over the thin film transistor 210, as illustrated in FIG. 4, the planarization layer 140 may substantially planarize an upper portion of a layer under the planarization layer 140. For example, the planarization layer 140 may substantially planarize an upper portion of a protection film covering the thin film transistor 210. The planarization layer 140 may be formed of an organic material, for example, acryl, benzocyclobutene (BCB), or hexamethyldisiloxane (HMDSO). Although FIG. 4 illustrates the planarization layer 140 as a single layer, in some implementations, the planarization layer 140 may be a multilayer and various modifications thereof are possible.

The display device 310 may be located on the planarization layer 140 in the display area DA of the substrate 100. The display device 310 may be an organic light-emitting device that includes, for example, the pixel electrode 311, a counter electrode 315, and an intermediate layer 313 provided between the pixel electrode 311 and the counter electrode 315 and including an emission layer. The pixel electrode 311 may be electrically connected to the thin film transistor 210 by contacting any one of the source electrode 215a and the drain electrode 215b via an opening portion formed the planarization layer 140, as illustrated in FIG. 4.

A pixel defining layer 150 may be provided over the planarization layer 140. The pixel defining layer 150 may define a pixel by having an opening corresponding to each of subpixels, for example, an opening that exposes at least a center portion of the pixel electrode 311. As illustrated in FIG. 4, the pixel defining layer 150 may increase a distance between an edge of the pixel electrode 311 and the counter electrode 315 above the pixel electrode 311, thereby preventing generation of arc at the edge of the pixel electrode 311. The pixel defining layer 150 may be formed of, for example, an organic material such as polyimide or HMDSO.

The intermediate layer 313 of the organic light-emitting device may have various structures. For example, the intermediate layer 313 may include a low molecular substance or a polymer substance. When the intermediate layer 313 includes a low molecular substance, the intermediate layer 313 may have a structure in which a hole injection layer (HIL), a hole transport layer (HTL), an emission layer (EML), an electron transport layer (ETL), and an electron injection layer (EIL) are stacked, and may be formed in a vacuum deposition method. When the intermediate layer 313 includes a polymer substance, the intermediate layer 313 may have a structure including a HTL and an EML where the HTL includes poly(3,4-ethylenedioxythiophene (PEDOT), and the emission layer includes a poly-phenylenevinylene (PPV) based polymer substance and a polyfluorene based polymer substance. The intermediate layer 313 may be formed by a screen printing method, an inkjet printing method, or a laser induced thermal imaging (LITI) method. The intermediate layer 313 may include a layer integrating the pixel electrodes 311 or may include a layer patterned to correspond to each of the pixel electrodes 311.

The counter electrode 315 may be provided above the display area DA to cover the display area DA. For example, the counter electrode 315 may be formed as one body with respect to a plurality of organic light-emitting devices and corresponding to the pixel electrodes 311.

The buffer layer 110, the gate insulating layer 121, the interlayer insulating layer 131, and/or the planarization layer 140 may be provided in the peripheral area PA, as illustrated in FIG. 4. The buffer layer 110, the gate insulating layer 121, the interlayer insulating layer 131, and/or the planarization layer 140 may be discontinuously arranged in the peripheral area PA. For example, the buffer layer 110, the gate insulating layer 121, the interlayer insulating layer 131, and/or the planarization layer 140 in the display area DA may extend to the peripheral area PA, and may be partially removed in the peripheral area PA. Accordingly, the buffer layer 110, the gate insulating layer 121, the interlayer insulating layer 131, and/or the planarization layer 140 in the display area DA may be spaced apart from the buffer layer 110, the gate insulating layer 121, the interlayer insulating layer 131, and/or the planarization layer 140 located at the edge of the substrate 100 in the peripheral area PA.

As described above, the thin film transistor 220 may be located in the first scan drive circuit SDR1 to the third scan drive circuit SDR3 in the peripheral area PA of the substrate 100. The thin film transistor 220 may include a second semiconductor layer 221 including amorphous silicon, polycrystalline silicon, or an organic semiconductor material, a gate electrode 223, a source electrode 225a, and a drain electrode 225b. The gate insulating layer 121, as described above, may be provided between the second semiconductor layer 221 and the gate electrode 223. In addition, the interlayer insulating layer 131 may be provided over the gate electrode 223, and the source electrode 225a and the drain electrode 225b may be provided over the interlayer insulating layer 131. The gate insulating layer 121 and the interlayer insulating layer 131 altogether may be referred to as the first insulating layer 141 provided between the source electrode 225a and the drain electrode 225b, and the second semiconductor layer 221, as described above. The first insulating layer 141 may include the second contact holes CT2, through which the source electrode 225a and the drain electrode 225b contact the second semiconductor layer 221.

The dummy contact holes DCT as described above may be located in a portion between the first scan drive circuit SDR1 to the third scan drive circuit SDR3 and the display area DA, which portion may be a part of the peripheral area PA of the substrate 100. The gate insulating layer 121 and the interlayer insulating layer 131 altogether may be referred to as the first insulating layer 141 as described above. The first insulating layer 141 may include the dummy contact holes DCT.

Figure 5:
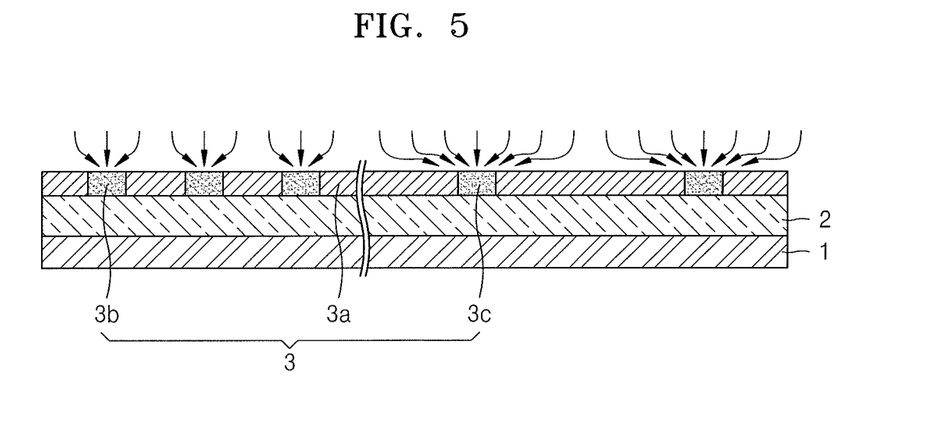
FIGS. 5 and 6 illustrate conceptual diagrams showing the generation of defects in a manufacturing process according to the density of positions where contact holes are to be formed.
Figure 6:
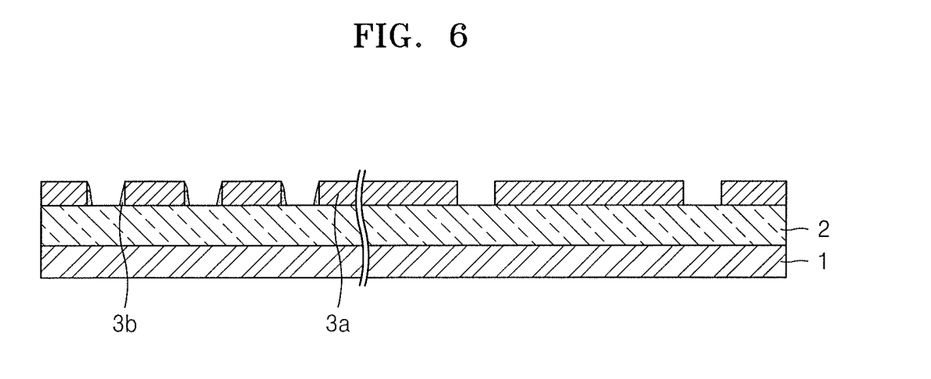

FIGS. 5 and 6 illustrate conceptual diagrams showing the generation of defects in a manufacturing process according to the density of positions where contact holes are to be formed. Referring to FIG. 5, a to-be-patterned layer 2 is located on a base layer 1, and a photoresist layer 3 is located on the to-be-patterned layer 2, to pattern the to-be-patterned layer 2. In the photoresist layer 3, a portion 3a is a part of the photoresist layer 3 that is not removed and remains, and portions 3b and 3c are parts of the photoresist layer 3 that are to be removed.

In a development process to remove the portions 3b and 3c from the photoresist layer 3, a developer contacts the entire surface of the photoresist layer 3. In this state, since the portion 3a of the photoresist layer 3 is not a part to be removed, the developer hardly reacts to the portion 3a of the photoresist layer 3, and accordingly the developer on the portion 3a of the photoresist layer 3 mainly reacts to the portions 3b and 3c of the photoresist layer 3 therearound, which are to be removed. In this state, since the density of the portions 3b of the photoresist layer 3 to be removed is relatively high and the density of the portions 3c of the photoresist layer 3 to be removed is relatively low, the amount of the developer reacting to the portions 3b of the photoresist layer 3 to be removed is smaller than the amount of the developer reacting to the portions 3c of the photoresist layer 3 to be removed. When development is performed in this state, a result as illustrated in FIG. 6 may be obtained. For example, when the density of the portions 3b of the photoresist layer 3 to be removed is high, removal of the portions 3b may not be complete. Accordingly, the width of the opening formed in the photoresist layer 3 may decrease as the density of the openings increases.

In this state, when the contact holes are formed by patterning the to-be-patterned layer 2 under the photoresist layer 3, the widths of contact holes may be decreased or contact holes may not be properly formed in a portion where the width of the opening formed in the photoresist layer 3 is narrow. Consequently, in the formation of contact holes in the to-be-patterned layer 2, when the density of contact holes formed in a specific first area is higher than the density of contact holes to be formed in a second area, the width of each of the contact holes formed in the first area may be narrower than the width of each of the contact holes formed in the second area, or the contact holes may not even be properly formed in the first area. Such inconsistency in the width of the contact holes may lead to defects later in manufactured products.

Referring to FIG. 3, as described above, in the display area DA, the first insulating layer 141 has the first contact holes CT1. In the first scan drive circuit SDR1 to the third scan drive circuit SDR3 in the peripheral area PA, the first insulating layer 141 has the second contact holes CT2. In this state, in the second portion EP2 that is a curved edge of the display area DA, a gap between the first scan drive circuit SDR1 to the third scan drive circuit SDR3 and the display area DA may be relatively large. If the first insulating layer 141 were to not have the dummy contact holes DCT in the second portion EP2, the density of the contact holes in an area around the second portion EP2 would be lower than the density of the contact holes in other areas. A difference in the density of the contact holes could cause a defect as described above with reference to FIGS. 5 and 6.

However, in the display apparatus according to the present embodiment, in an area around the second portion EP2 that is a curved edge of the display area DA, the first insulating layer 141 may include the dummy contact holes DCT between the first scan drive circuit SDR1 to the third scan drive circuit SDR3 and the display area DA. Accordingly, when are referred to as a plurality of contact holes, a rapid difference in the density of the contact holes, including the first contact holes CT1, the second contact holes CT2, and the dummy contact holes DCT altogether, in the area around the second portion EP2 may be reduced. Accordingly, the display apparatus according to the present embodiment may effectively prevent or reduce the likelihood of a defect in the formation of the contact holes that may occur in the manufacturing process.

As illustrated in FIGS. 2 and 3, a dummy scan drive circuit DSDR may be located between the first scan drive circuit SDR1 and the second scan drive circuit SDR2, in the area around the second portion EP2 that is a curved edge of the display area DA. When the second portion EP2 has a curved shape as described above, the connecting wire CW2 connecting the first scan drive circuit SDR1 and the scan lines SL1, or the connecting wire CW2 connecting the second scan drive circuit SDR2 and the scan lines SL2, may not have a uniform extension direction. Accordingly, the length of the connecting wire CW2 may increase. In these circumstances, to reduce the length of the connecting wire CW2, the first scan drive circuit SDR1 electrically connected to the scan lines SL1 and the second scan drive circuit SDR2 electrically connected to the scan lines SL2 may be spaced apart from each other. The dummy scan drive circuit DSDR may be located between the first scan drive circuit SDR1 and the second scan drive circuit SDR2, which are spaced part as described above.

As described above, the first insulating layer 141 of the first scan drive circuit SDR1 and the second scan drive circuit SDR2 include the second contact holes CT2, as illustrated in FIG. 3. The second contact holes CT2 may be located at an approximately uniform density in the first insulating layer 141 in the first scan drive circuit SDR1 and the second scan drive circuit SDR2. In the case of the dummy scan drive circuit DSDR, the first insulating layer 141 may include a plurality of additional dummy contact holes ADCT formed at a density that is the same as or similar to that of the second contact holes CT2. Accordingly, the first insulating layer 141 may include a plurality of contact holes, including the second contact holes CT2 and the additional dummy contact holes ADCT altogether, at an approximately uniform density in the first scan drive circuit SDR1, the dummy scan drive circuit DSDR, and the second scan drive circuit SDR2. In the display apparatus according to the present embodiment, dummy contact holes may be located between the first scan drive circuit SDR1 and the dummy scan drive circuit DSDR or between the second scan drive circuit SDR2 and the dummy scan drive circuit DSDR and the defective formation of contact holes that could occur in the manufacturing process may be effectively prevented or reduced. D.

The additional dummy contact holes ADCT in the first insulating layer 141 in the dummy scan drive circuit DSDR may have a shape that is the same as or similar to that of the dummy contact holes DCT illustrated in FIG. 4.

In the case of the first contact holes CT1 of the display area DA, as illustrated in FIG. 4, the source electrode 215a or the drain electrode 215b may be connected to the first semiconductor layer 211 thereunder. For example, the first contact holes CT1 of the display area DA may be filled with a material that forms the source electrode 215a or the drain electrode 215b. The source electrode 215a or the drain electrode 215b may be referred to collectively as a first wiring 151. A surface of the first wiring 151 facing the substrate 100 may directly contact a surface of the interlayer insulating layer 131 facing away the substrate 100.

In the case of the second contact holes CT2 of the peripheral area PA, as illustrated in FIG. 4, the source electrode 225a or the drain electrode 225b may be connected to the second semiconductor layer 221 thereunder. The second contact holes CT2 of the peripheral area PA may be filled with a material for forming the source electrode 225a or the drain electrode 225b. The source electrode 225a or the drain electrode 225b may be a second wiring. The first contact holes CT1 may be filled with the first wiring 151, and the second contact holes CT2 may be filled with the second wiring 161.

In contrast, the dummy contact holes DCT in the peripheral area PA are not filled with a wiring. Instead, the dummy contact holes DCT may be filled with an insulating layer such as a protection layer and/or the planarization layer, 140 as illustrated in FIG. 4. In the dummy scan drive circuit DSDR, the additional dummy contact holes ADCT in the first insulating layer 141 may be filled with an insulating layer such as the protection layer and/or the planarization layer 140.

The source electrode 215a or the drain electrode 215b in the display area DA and the source electrode 225a or the drain electrode 225b in the peripheral area PA may be simultaneously formed with the same material. Accordingly, in this case, each of the first wirings 151 may be understood as having the same material as the second wirings 161.

As described above, the first scan drive circuit SDR1 to the third scan drive circuit SDR3 and the scan lines SL1, SL2, and SL3 may be electrically connected to each other. To this end, the connecting wires CW1 and CW2 may be provided between the first scan drive circuit SDR1 to the third scan drive circuit SDR3 and the scan lines SL1, SL2, and SL3. Consequently, the connecting wires CW1 and CW2 may electrically connect the first wiring, for example, the source electrode 225a or the drain electrode 225b of the first scan drive circuit SDR1, to the third scan drive circuit SDR3, and the second wiring, for example, the source electrode 215a or the drain electrode 215b, in the display area DA. Accordingly, each of the first wirings 151 may be electrically connected to a corresponding one of the second wirings 161.

The connecting wires CW1 and CW2 may be located in a different layer from the scan lines SL1, SL2, and SL3, and may be connected to each other via the contact holes formed in the insulating layer between the connecting wires CW1 and CW2 and the scan lines SL1, SL2, and SL3. In some implementations, the connecting wires CW1 and CW2 and the scan lines SL1, SL2, and SL3 may be simultaneously formed of the same material in the same layer. In this case, a bridge wires electrically connecting the connecting wires CW1 and CW2 and the scan lines SL1, SL2, and SL3 may be located in a different layer from the connecting wires CW1 and CW2 and the scan lines SL1, SL2, and SL3. Each of the connecting wires CW1 and CW2 and any one of the scan lines SL1, SL2, and SL3 corresponding thereto may be formed as one body. Consequently, each of the first wirings 151 may form one body with a corresponding one of the second wirings 161. In any case, it may be understood that the first wirings 151 are electrically connected to conductive layers, and the second wirings 161 are electrically connected to conductive layers.

As described above, in the thin film transistor 210 located in the display area DA, the first semiconductor layer 211 is located in the lower portion and the source electrode 215a and the drain electrode 215b are located in the upper portion. The source electrode 215a and the drain electrode 215b may contact the first semiconductor layer 211 thereunder via the first contact holes CT1 formed in the first insulating layer 141 provided between the first semiconductor layer 211, and the source electrode 215a and the drain electrode 215b. When the thin film transistors 210 are located in the display area DA, the first semiconductor layers 211 are provided. The first semiconductor layers 211 may be understood to be provided between the substrate 100 and the first insulating layer 141. At least a part of the upper surface of each of the first semiconductor layers 211 facing the first insulating layer 141 may be understood to be located at a lower end of the first contact holes CT1.

Likewise, in the thin film transistor 220 located in the peripheral area PA, the second semiconductor layer 221 is located in the lower portion and the source electrode 225a and the drain electrode 225b are located in the upper portion. The source electrode 225a and the drain electrode 225b may contact the second semiconductor layer 221 thereunder via the second contact holes CT2 formed in the first insulating layer 141 provided between the second semiconductor layer 221, and the source electrode 225a and the drain electrode 225b. When the thin film transistors 220 are located in the peripheral area PA, the second semiconductor layers 221 are provided. It may be understood that the second semiconductor layers 221 may be provided between the substrate 100 and the first insulating layer 141. At least a part of the upper surface of each of the second semiconductor layers 221 facing the first insulating layer 141 may be located at a lower end of the second contact holes CT2.

As illustrated in FIG. 4, the display apparatus according to the present embodiment may include dummy semiconductor layers 201. It may be understood that the dummy semiconductor layers 201 are provided between the substrate 100 and the first insulating layer 141, and at least a part of an upper surface of each of the dummy semiconductor layers 201 facing the first insulating layer 141 is located at a lower end of the dummy contact holes DCT.

The first contact holes CT1, the second contact holes CT2, and the dummy contact holes DCT may be simultaneously formed by patterning the first insulating layer 141. In this state, when patterning the first insulating layer 141, that is, the gate insulating layer 121 and the interlayer insulating layer 131, the buffer layer 110 and/or the substrate 100 under the first insulating layer 141 could be damaged, and thus it is desirable to prevent or minimize the generation of damage. The formation of the first contact holes CT1 and the second contact holes CT2 partially exposes the second semiconductor layers 221 located between the buffer layer 110 and the first insulating layer 141. Consequently, the second semiconductor layers 221 may protect the buffer layer 110 and/or the substrate 100 thereunder.

When the dummy semiconductor layers 201 are located under the dummy contact holes DCT, the formation of the dummy contact holes DCT partially exposes the dummy semiconductor layers 201 located between the buffer layer 110 and the first insulating layer 141. Consequently, the dummy semiconductor layers 201 may protect the buffer layer 110 and/or the substrate 100 thereunder. Although FIG. 4 illustrates that two dummy contact holes DCT correspond to one dummy semiconductor layer 201, in some implementations, the dummy contact holes DCT and the dummy semiconductor layers 201 may have a one-to-one correspondence and various modifications thereof are possible.

When the buffer layer 110 and/or the substrate 100 are formed of a material having excellent corrosion resistance, for example, when the substrate 100 is formed of a glass material, the dummy semiconductor layers 201 may be omitted.

As described above, in the second portion EP2 that is a curved edge of the display area DA, a gap between the first scan drive circuit SDR1 or the second scan drive circuit SDR2, which is located adjacent to the second portion EP2, and the second portion EP2, may be relatively large. For example, the gap may be relatively greater than the gap between the first portion EP1 that is a part of the first edge E1 that is a linear edge of the display area DA and the third scan drive circuit SDR3 located adjacent to the first portion EP1. Since the second portion EP2 has a curved shape, the connecting wires CW2 connecting the first scan drive circuit SDR1 and the scan lines SL1 or the connecting wires CW2 connecting the second scan drive circuit SDR2 and the scan lines SL2 may have not a uniform extension direction. Accordingly, the length of the connecting wire CW2 is greater.

In addition, the greatest distance between the closest ones of the connecting wires CW2 passing between the dummy contact holes DCT is greater than the largest distance between the closest ones of the connecting wires CW1 adjacent to the first portion EP1. This is because, since the connecting wires CW2 connecting the first scan drive circuit SDR1 and the scan lines SL1 or the connecting wires CW2 connecting the second scan drive circuit SDR2 and the scan lines SL2 have no uniform extension directions and have inclined extension directions with respect to each other, the largest distance between the closest ones of the connecting wires CW2 is increased accordingly. The largest distance between the closest ones of the connecting wires CW2 may be, for example, a distance between the closest ones of the connecting wires CW2 in the second portion EP2 of FIG. 3. For reference, although FIG. 3 illustrates that the distance between the connecting wires CW1 is always constant, the present invention is not limited thereto.

Figure 7:
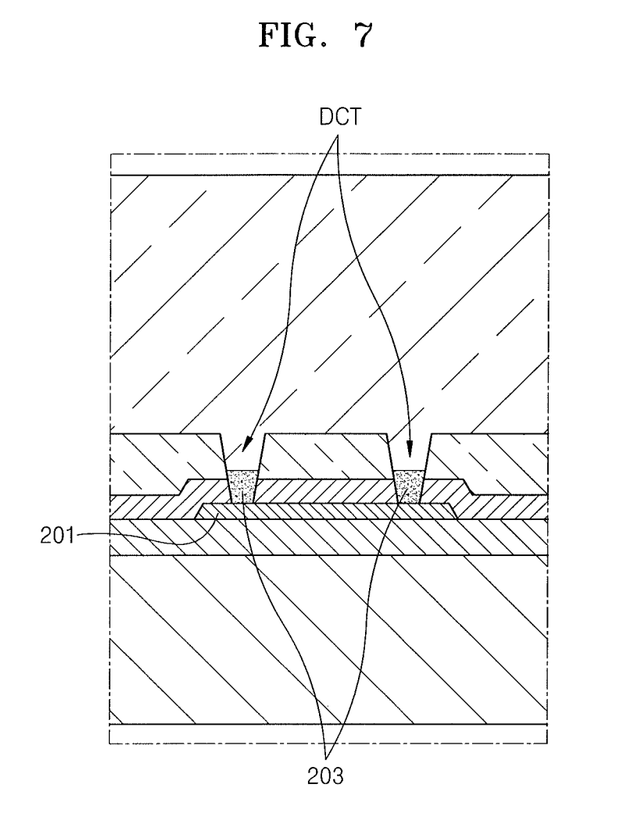
FIG. 7 illustrates a cross-sectional view schematically depicting a portion of a display apparatus according to another embodiment.

FIG. 7 illustrates a cross-sectional view schematically depicting a portion of a display apparatus according to another embodiment. FIG. 7 illustrates an enlarged view of an area around the dummy contact holes DCT located in the peripheral area PA. A conductive material layer 203 may be located in the dummy contact holes DCT. An end portion of the conductive material layer 203 facing the second insulating layer, for example, the planarization layer 140 located above the conductive material layer 203 and the first insulating layer 141, may be located inside the dummy contact holes DCT. The conductive material layer 203 inside the dummy contact holes DCT may not be electrically connected to another external conductive layer.

In the manufacturing process, after the first contact holes CT1, the second contact holes CT2, and the dummy contact holes DCT are formed in the first insulating layer 141, a conductive layer may be formed to cover the first insulating layer 141. The conductive layer may be patterned to fill the first contact holes CT1 and the second contact holes CT2, and the source electrodes 225a and the drain electrodes 225b located on the first insulating layer 141 may be formed. In this state, the portion of the conductive layer filling the dummy contact holes DCT may be entirely removed in a pattering process. As illustrated in FIG. 7, when the dummy contact holes DCT are deep, the conductive layer may not be completely removed and may remain in the dummy contact holes DCT.

In some embodiments, the substrate 100 may include the display area DA and the peripheral area PA outside the display area DA. The first insulating layer 141 may be located on the substrate 100 in the display area DA and the peripheral area PA. The first insulating layer 141 may include the first contact holes CT1 located in the display area DA, the second contact holes CT2 located in the peripheral area PA, and the dummy contact holes DCT located between the first contact holes CT1 and the second contact holes CT2. The connecting wires CW2 may electrically connect a material filling each of the first contact holes CT1 and a material filling a corresponding one of the second contact holes CT2 and may between the dummy contact holes DCT.

By way of summation and review, when some of the pixels located in a display area are defective, the quality of an image realized by the display apparatus may deteriorate. Accordingly, it is desirable to prevent the generation of a defective pixel in the manufacturing process or to reduce a defective pixel generation rate.

In a general manufacturing process, defective pixels may be generated at an edge of the display device.

Embodiments provide a display apparatus that allows for a generation of defects in pixels at an edge of a display area in a manufacturing process to be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display apparatus, comprising:
    a substrate including a display area and a peripheral area outside the display area;
    a first drive circuit located in the peripheral area, the first drive circuit to generate a scan signal and apply the scan signal to a thin film transistor that is located in the display area and is electrically connected to a pixel electrode;
    a first insulating layer over the substrate in the display area and the peripheral area, the first insulating layer including a plurality of first contact holes located in the display area and a plurality of first dummy contact holes in the peripheral area such that the plurality of first dummy contact holes are located between the plurality of first contact holes and the first drive circuit; and
    a second insulating layer disposed over the first insulating layer and filling the plurality of first dummy contact holes.

2. The display apparatus as claimed in claim 1, further comprising:
    first wirings filling the plurality of first contact holes; and
    first connecting wirings connecting the first wirings to the first drive circuit, the first connecting wirings passing between the plurality of first dummy contact holes.

3. The display apparatus as claimed in claim 1, further comprising a second drive circuit located in the peripheral area, wherein
    the first insulating layer further includes a plurality of second contact holes in the display area and a plurality of second dummy contact holes in the peripheral area such that the plurality of second dummy contact holes area located between the plurality of second contact holes and the second drive circuit, and
    the second insulating layer fills the plurality of second dummy contact holes.

4. The display apparatus as claimed in claim 3, further comprising:
    first wirings filling the plurality of first contact holes;
    second wirings filling the plurality of second contact holes;
    first connecting wirings connecting the first wirings to the first drive circuit, the connecting wirings passing between the plurality of first dummy contact holes; and
    second connecting wirings connecting the second wirings to the second drive circuit, the second connecting wirings passing between the plurality of second dummy contact holes.

5. The display apparatus as claimed in claim 4, wherein the first insulating layer further includes a plurality of third dummy contact holes between the plurality of first dummy contact holes and the plurality of second dummy contact holes.

6. The display apparatus as claimed in claim 5, wherein the second insulating layer fills the plurality of third dummy contact holes.

7. The display apparatus as claimed in claim 3, wherein the first insulating layer further includes a plurality of additional dummy contact holes between the first drive circuit and the second drive circuit.

8. The display apparatus as claimed in claim 7, wherein the second insulating layer fills the plurality of additional dummy contact holes.

9. The display apparatus as claimed in claim 3, further comprising a dummy drive circuit located in the peripheral area and between the first drive circuit and the second drive circuit.

10. The display apparatus as claimed in claim 9, wherein the first insulating layer further includes a plurality of third dummy contact holes between the plurality of first dummy contact holes and the plurality of second dummy contact holes and between the dummy drive circuit and the display area.

11. The display apparatus as claimed in claim 10, wherein the second insulating layer fills the plurality of third dummy contact holes.

12. The display apparatus as claimed in claim 1, further comprising a plurality of first semiconductor layers between the substrate and the first insulating layer,
    wherein at least a part of an upper surface of each of the plurality of first semiconductor layers that faces the first insulating layer is located at a lower end the plurality of first contact holes.

13. The display apparatus as claimed in claim 12, further comprising a plurality of dummy semiconductor layers between the substrate and the first insulating layer,
    wherein at least a part of an upper surface of each of the plurality of dummy semiconductor layers, the upper surface facing the first insulating layer, is located at a lower end of the plurality of first dummy contact holes.

14. The display apparatus as claimed in claim 1, wherein at least a portion of an edge of the display area has a round shape, and
    the plurality of first dummy contact holes are located adjacent to the portion of the edge of the display area having the round shape.

15. The display apparatus as claimed in claim 1, further comprising a conductive material layer located in the plurality of first dummy contact holes, an end portion of the conductive material layer facing the second insulating layer being located in the plurality of first dummy contact holes.

16. The display apparatus as claimed in claim 1, wherein the second insulating layer completely fills the plurality of first dummy contact holes.

17. The display apparatus as claimed in claim 1, wherein the second insulating layer directly contacts a bottom surface of at least one first dummy contact holes.

* * * * *